(12) United States Patent
Mori et al.

(10) Patent No.: US 8,780,609 B2
(45) Date of Patent: Jul. 15, 2014

(54) VARIABLE-RESISTANCE MEMORY DEVICE AND DRIVING METHOD THEREOF

(75) Inventors: Hironobu Mori, Nagasaki (JP); Hiroshi Yoshihara, Nagasaki (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 13/551,228

(22) Filed: Jul. 17, 2012

(65) Prior Publication Data

US 2013/0051122 A1 Feb. 28, 2013

(30) Foreign Application Priority Data

Aug. 25, 2011 (JP) ................................ 2011-183829

(51) Int. Cl.
*G11C 11/00* (2006.01)
(52) U.S. Cl.
USPC .......................................... 365/148; 365/158
(58) Field of Classification Search
USPC ................................................. 365/148, 158
See application file for complete search history.

(56) References Cited

U.S. PATENT DOCUMENTS

| 7,233,537 | B2 * | 6/2007 | Tanizaki et al. | 365/209 |
| 7,453,719 | B2 * | 11/2008 | Sakimura et al. | 365/158 |
| 8,369,129 | B2 * | 2/2013 | Fujita et al. | 365/148 |

FOREIGN PATENT DOCUMENTS

JP 2010-049730 3/2010

OTHER PUBLICATIONS

K. Aratani et al., "A Novel Resistance Memory with High Scalability and Nanosecond Switching," Technical Digest IEDM 2007, pp. 783 to 786.

* cited by examiner

*Primary Examiner* — Michael Tran
(74) *Attorney, Agent, or Firm* — Rader, Fishman & Grauer PLLC

(57) ABSTRACT

A variable-resistance memory device includes a memory array section including a main memory cell employing a storage element having a resistance increasing and decreasing in a reversible manner in accordance with application of a signal set at one of different polarities to the opposite ends of the storage element, and a reference cell section including a reference cell provided with a storage element having a resistance increasing and decreasing in a reversible manner in accordance with application of a signal set at one of different polarities to the opposite ends of the storage element and generating a reference current used for recognizing data of the main memory cell. The direction of an applied current serving as the reference current is set in accordance with the resistance state of the reference cell.

17 Claims, 8 Drawing Sheets

FIG.4
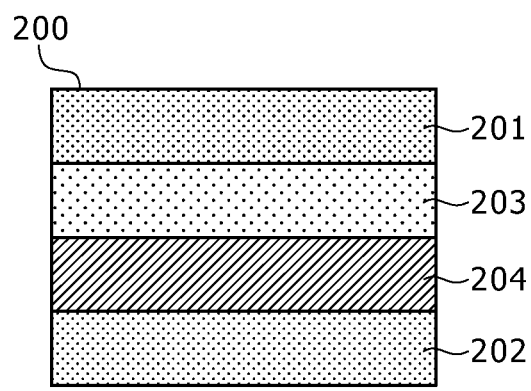
FIG.5A  FIG.5B  FIG.5C  FIG.5D
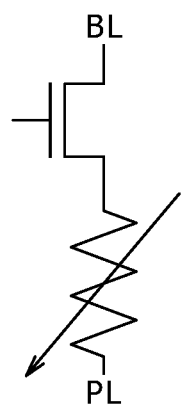 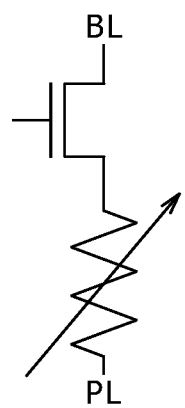 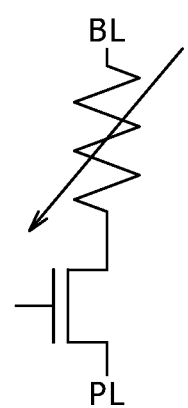 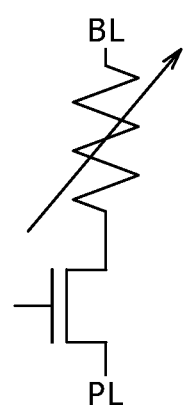

GENERATING A REFERENCE LEVEL BY COMBINING CELLS IN A LOW RESISTANCE STATE

VARIABLE-RESISTANCE MEMORY DEVICE AND DRIVING METHOD THEREOF

BACKGROUND

The present disclosure relates to a variable-resistance memory device including a storage element with a resistance varying due to application of a signal set at one of different polarities to opposite ends of the storage element and relates to a method for driving the variable-resistance memory device.

There is known a variable-resistance memory device having a storage element included in every memory cell of the variable-resistance memory device to serve as a storage element with a resistance varying due to injection of conductive ions into an insulation film or withdrawal of such ions from the insulation film. For more information on the variable-resistance memory device, refer to documents such as K. Aratani, etc. "A Novel Resistance Memory with High Scalability and Nanosecond Switching," Technical Digest IEDM 2007, pp. 783 to 786.

The storage element has a laminated structure in which a layer for supplying the conductive ions and the insulation film are formed at locations between two electrodes.

Each memory cell cited above is configured to include the storage element and an access transistor which are connected to each other in series at locations between first and second lines drivable by adoption of an active matrix driving method. Since the memory cell has one access transistor (T) and one storage element with a variable resistor (R) as described above, the memory cell is referred to as a 1T1R memory cell.

In addition, the variable-resistance memory device including such 1T1R memory cells is referred to as a ReRAM (Resistance Random Access Memory).

As described in documents such as K. Aratani, etc. "A Novel Resistance Memory with High Scalability and Nanosecond Switching," Technical Digest IEDM 2007, pp. 783 to 786, in the ReRAM, the magnitude of the resistance is associated with a state in which data has been written into the storage element and a state in which data has been erased from the storage element. Data is written into the storage element and erased from the storage element by applying a pulse having a short duration in the ns (nano-second) order. Thus, in the same way as the RAM (Random Access Memory), the ReRAM is capable of carrying out operations at a high speed and serves as an NVM (Non-Volatile Memory) which draws much attention.

In the variable-resistance memory device such as the ReRAM and an MRAM, a high-resistance state and a low-resistance state are recognized as a state in which data has been written into the storage element and a state in which data has been erased from the storage element. It is thus necessary to generate a reference current as described in documents such as Japanese Patent Laid-open No. 2010-049730. The MRAM is a spin injection magnetic resistance RAM.

In order to effectively suppress process variations and effects such as temperature-characteristic following effects, the reference current is generated by a reference cell which makes use of the same elements as the memory cell utilizing the reference current as a current for recognizing stored information.

In addition, in order to obtain the reference current, the reference current is generated by making use of two or more single units or a combination of the single units. The two or more single units are single units in the high-resistance and low-resistance states of the memory cell. For the two different types of the states, data is read out in the same read current direction.

SUMMARY

In the case of the variable-resistance memory device, however, the read current is also used as the recording current. Thus, depending on the resistance state, an incorrect write operation may be carried out in some cases.

In addition, one reference cell is typically provided for many bits. Thus, the frequency of the accesses to the reference cell is about three to five times the frequency of the accesses to the ordinary memory cell. Accordingly, it is necessary to sustain a more stable resistance state.

Since the frequency of the accesses to the reference cell is high, however, the probability that an incorrect write operation is inadvertently carried out inevitably rises.

It is thus desirable to provide a variable-resistance memory device capable of generating a reference current with higher reliability by means of a configuration, in which a read current is set in accordance with the resistance state of a reference cell, without entailing resistance changes caused by an incorrect write operation. In addition, it is desirable to provide a method for driving the variable-resistance memory device.

A variable-resistance memory device according to an embodiment of the present disclosure includes:

a memory array section including a main memory cell employing a storage element having a resistance increasing and decreasing in a reversible manner in accordance with application of a signal set at one of different polarities to the opposite ends of the storage element; and a reference cell section including a reference cell provided with a storage element having a resistance increasing and decreasing in a reversible manner in accordance with application of a signal set at one of different polarities to the opposite ends of the storage element and generating a reference current used for recognizing data of the main memory cell. The direction of an applied current serving as the reference current is set in accordance with the resistance state of the reference cell.

A method for driving a variable-resistance memory device according to another embodiment of the present embodiment includes:

reading out data from a main memory cell to a first bit line by changing the resistance of a storage element of the main memory cell through application of a signal set at one of different polarities to the opposite ends of the storage element so as to increase or decrease the resistance in a reversible manner;

generating a reference current flowing to a second bit line as a reference current, which is used for recognizing data of the main memory cell, by making use of a reference cell including a storage element having a resistance increasing and decreasing in a reversible manner in accordance with application of a signal set at one of different polarities to the opposite ends of the storage element; and determining information stored in the main memory cell by making use of a sense amplifier for comparing a current flowing to the first bit line read out above with the reference current flowing to the second bit line. The direction of an applied current serving as the reference current is set in accordance with the resistance state of the reference cell.

In accordance with the present disclosure, there is provided a configuration in which a read-out current is set in accordance with the resistance state of a reference cell so that a more reliable reference current can be generated without causing resistance changes due to an incorrect write operation.

BRIEF DESCRIPTION OF THE DRAWINGS

FIG. 4 is a diagram showing the configuration of a variable-resistance storage element also referred to as a variable-resistance cell resistor;

FIGS. 5A to 5D are diagrams each showing a series circuit having an access transistor and a variable-resistance storage element also referred to as a variable-resistance cell resistor;

DETAILED DESCRIPTION OF THE PREFERRED EMBODIMENT

Figure 1:
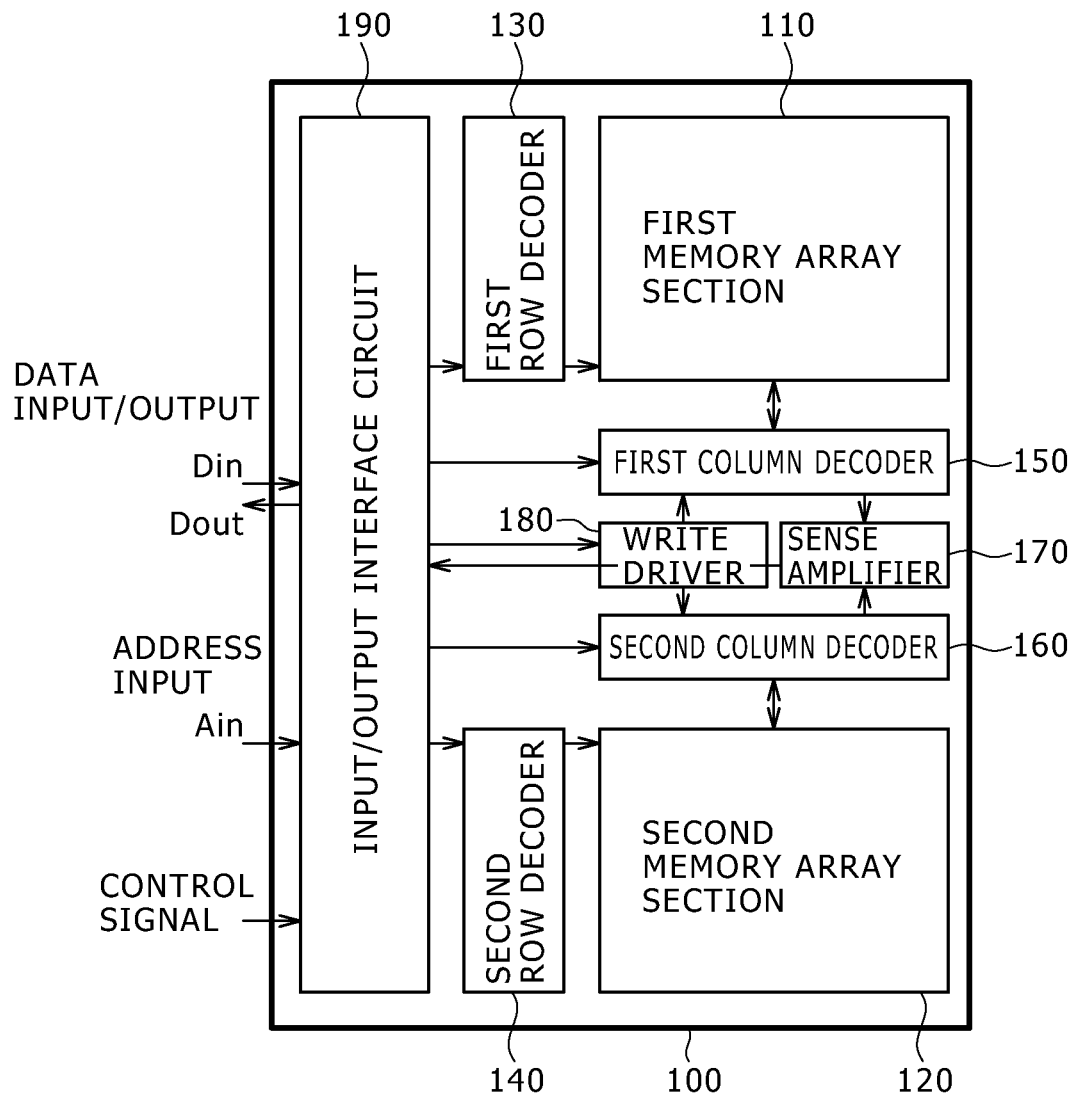
FIG. 1 is a diagram showing a typical configuration of a memory chip of a variable-resistance memory device according to an embodiment of the present disclosure.

An embodiment of the present disclosure is explained in the following description by referring to the accompanying diagrams. It is to be noted that the description is divided into topics arranged as follows.
1: Typical Configuration of the Memory Chip
2: Memory-Cell Configuration
3: First Typical Configuration of the Reference Cell Section
4: Second Typical Configuration of the Reference Cell Section
5: Third Typical Configuration of the Reference Cell Section
<1: Typical Configuration of the Memory Chip>
FIG. 1 is a diagram showing a typical configuration of a memory chip of a variable-resistance memory device according to an embodiment of the present disclosure.

As shown in the figure, the memory chip 100 includes a first memory array section 110, a second memory array section 120, a first row decoder 130, a second row decoder 140, a first column decoder 150 and a second column decoder 160.

In addition, the memory chip 100 also has a sense amplifier 170, a write driver 180 and an input/output interface circuit 190.

In the memory chip 100, each of the sense amplifier 170 and the write driver 180 is shared by the first memory array section 110 and the second memory array section 120.

Figure 2:
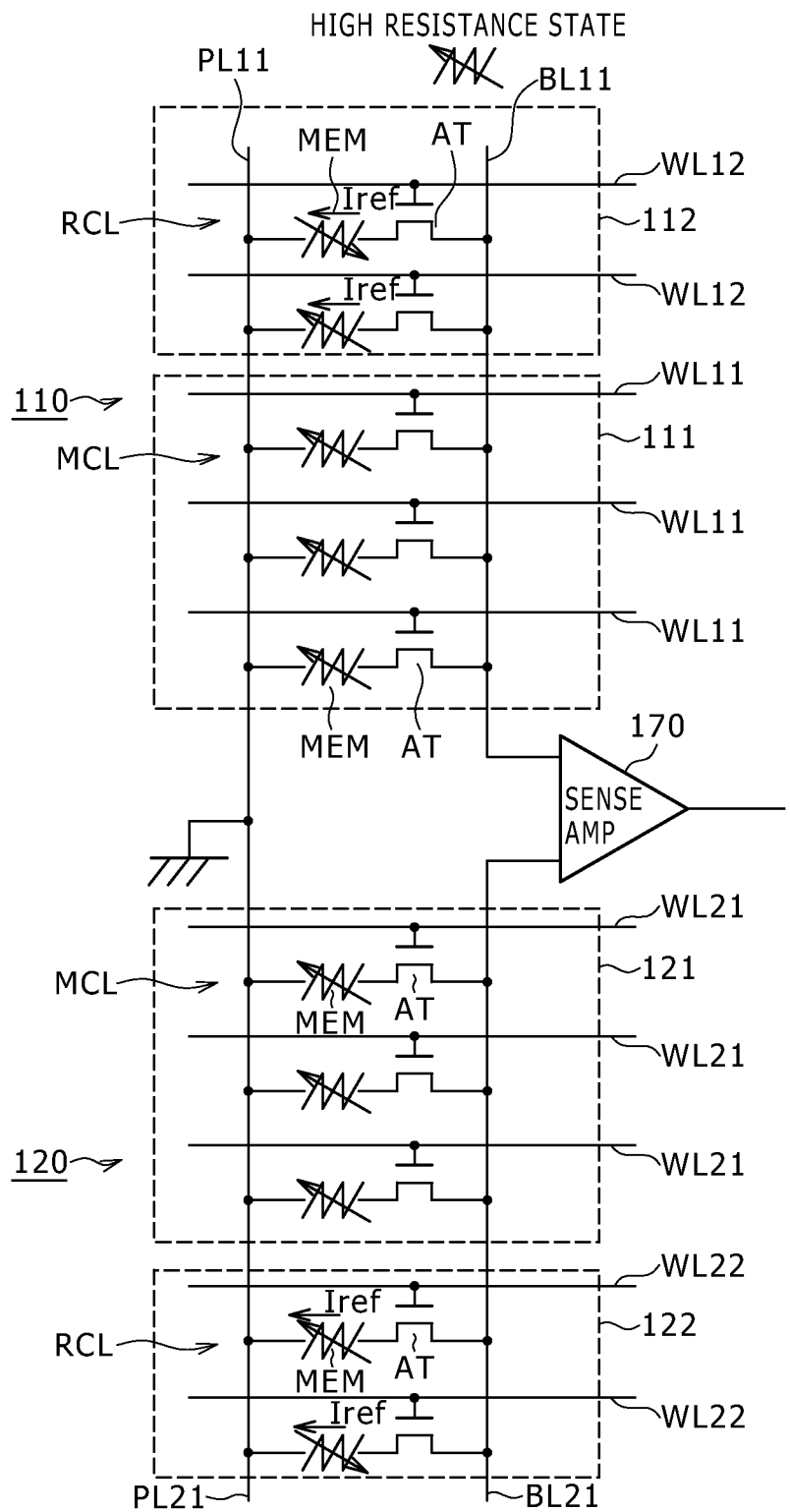
FIG. 2 is a diagram showing a simplified typical configuration of a memory array section according to the embodiment.

FIG. 2 is a diagram showing a simplified typical configuration of the memory array sections 110 and 120 according to the embodiment.

The first memory array section 110 is configured to include a main memory cell array 111 and a reference cell section 112.

By the same token, the second memory array section 120 is configured to include a main memory cell array 121 and a reference cell section 122.

The main memory cell array 111 employed in the first memory array section 110 includes a plurality of variable-resistance memory cells MCL each also referred to as a main memory cell MCL. The variable-resistance memory cells MCL are laid out to form an (m×n) matrix including m rows and n columns. In the case of the configuration shown in FIG. 2, however, the matrix is shown as merely a typical (3×1) matrix including 3 rows and 1 column in order to make the following description simple.

The reference cell section 112 is provided for each column of the matrix of the main memory cell array 111. The reference cell section 112 is configured to include one reference cell RCL or a plurality of reference cells RCL. The reference cell RCL is used for generating a reference current Iref.

As will be described later in detail, each of the variable-resistance memory cells MCL is basically created to include a variable-resistance storage element MEM and an access transistor AT. By the same token, each of the reference cells RCL is also basically created to include a variable-resistance storage element MEM and an access transistor AT. As explained earlier, the variable-resistance storage element MEM is also referred to as a variable-resistance cell resistor MEM.

Each column of the first memory array section 110 is provided with a first line (bit line) BL11 and a second line (plate line) PL11. The first line BL11 and the second line PL11 are common lines shared by the main memory cell array 111 and the reference cell section 112.

In addition, in the first memory array section 110, each row of the main memory cell array 111 is provided with a third line (word line) WL11. By the same token, each row of the reference cell section 112 is provided with a fourth line (reference word line) WL12.

As described above, each column of the first memory array section 110 is provided with main memory cells MCL and reference cells RCL. A particular end of each of the main memory cells MCL is connected to the first line BL11 whereas the other end of each of the main memory cells MCL is connected to the second line PL11. By the same token, a particular end of each of the reference cells RCL is connected to the first line BL11 whereas the other end of each of the reference cells RCL is connected to the second line PL11.

The gate electrode of the access transistor AT employed in the main memory cell MCL provided for every row of the main memory cell array 111 is connected to the third line WL11 which is a common line shared by all columns.

On the other hand, the gate electrode of the access transistor AT employed in the reference cell RCL provided for every row of the reference cell section 112 is connected to the fourth line WL12 which is also a common line shared by all columns.

The main memory cell array 121 employed in the second memory array section 120 includes a plurality of variable-resistance memory cells MCL. The variable-resistance memory cells MCL are laid out to form an (m×n) matrix including m rows and n columns. In the case of the configuration shown in FIG. 2, however, the matrix is shown as merely a typical (3×1) matrix including 3 rows and 1 column in order to make the following description simple.

The reference cell section 122 is provided for each column of the matrix of the main memory cell array 121. The reference cell section 122 is configured to include one reference cell RCL or a plurality of reference cells RCL for generating a reference current Iref.

As will be described later in detail, each of the variable-resistance memory cells MCL is basically created to include a variable-resistance storage element MEM and an access transistor AT. By the same token, each of the reference cells RCL is also basically created to include a variable-resistance storage element MEM and an access transistor AT. As explained earlier, the variable-resistance storage element MEM is also referred to as a variable-resistance cell resistor MEM.

Each column of the second memory array section 120 is provided with a first line (bit line) BL21 and a second line (plate line) PL21. The first line BL21 and the second line PL21 are common lines shared by the main memory cell array 121 and the reference cell section 122.

In addition, in the second memory array section 120, each row of the main memory cell array 121 is provided with a third line (word line) WL21. By the same token, each row of the reference cell section 122 is provided with a fourth line (reference word line) WL22.

As described above, each column of the second memory array section 120 is provided with main memory cells MCL and reference cells RCL. A particular end of each of the main memory cells MCL is connected to the first line BL21 whereas the other end of each of the main memory cells MCL is connected to the second line PL21. By the same token, a particular end of each of the reference cells RCL is connected to the first line BL21 whereas the other end of each of the reference cells RCL is connected to the second line PL21.

The gate electrode of the access transistor AT employed in the main memory cell MCL provided for every row of the main memory cell array 121 is connected to the third line WL21 which is a common line shared by all columns.

On the other hand, the gate electrode of the access transistor AT employed in the reference cell RCL provided for every row of the reference cell section 122 is connected to the fourth line WL22 which is also a common line shared by all columns.

It is to be noted that, in this embodiment, the second lines PL11 and PL21 form a single common line shared by the first memory array section 110 and the second memory array section 120.

In addition, the first line BL11 employed in the first memory array section 110 and the first line BL21 employed in the second memory array section 120 are each connected to one of the input terminals of the sense amplifier 170.

In the memory chip 100, in a read-out operation carried out by making an access to the main memory cell array 111 employed in the first memory array section 110, a reference current Iref generated by the reference cell section 122 employed in the second memory array section 120 is used.

By the same token, in the memory chip 100, in a read-out operation carried out by making an access to the main memory cell array 121 employed in the second memory array section 120, a reference current Iref generated by the reference cell section 112 employed in the first memory array section 110 is used.

As described above, the reference cell section 112 is a section for generating a reference current Iref used for recognizing the data of a main memory cell MCL employed in the main memory cell array 121 included in the second memory array section 120. On the other hand, the reference cell section 122 is a section for generating a reference current Iref used for recognizing the data of an main memory cell MCL employed in the main memory cell array 111 included in the first memory array section 110.

In addition, the reference cell section 112 and the reference cell section 122, which are provided by this embodiment, each set the direction of an applied current serving as the reference current Iref in accordance with the resistance state of the reference cell RCL.

As will be described later in detail, each of the reference cell section 112 and the reference cell section 122 can have any one of first, second and third configurations, for example.

In the first configuration, reference cells in a high-resistance state are used. These reference cells are configured to form single units or configured by connecting the reference cells in parallel to each other. The reference cells configured in this way are driven to generate a reference current in a current direction that does not change the storage state which is the high-resistance state.

In the second configuration, reference cells in a low-resistance state are used. These reference cells are configured to form single units or configured by connecting the reference cells in series to each other. The reference cells configured in this way are driven to generate a reference current in a current direction that does not change the storage state which is the low-resistance state.

The third configuration includes a plurality of combinations having reference cells in a high-resistance state and reference cells in a low-resistance state. These reference cells are configured to form single units, configured by connecting the reference cells in series to each other or configured by connecting the reference cells in parallel and in series to each other. The reference cells configured in this way are driven to generate a reference current in a current direction that does not change the storage state for each of the reference cells in the high-resistance state and the reference cells in the low-resistance state.

Each of the reference cell sections 112 and 122 is configured as described above because of reasons described as follows.

A reference current can be generated by making use of a resistive element having a state which does not change. In the case of a device having a large resistance change, however, if the device is configured to make use of resistive elements such as poly-silicon resistors, a very large area is required, making such a device undesirable.

In addition, in order to generate a reference current flowing through the on-state resistance of a transistor, it is necessary to provide a special circuit for generating a low gate voltage for the transistor. Thus, the circuit configuration becomes complex so that such a device is also undesirable as well.

An operation to generate a reference current by making use of a memory cell to serve as a reference current demonstrating following-characteristics which are good for process variations and for a temperature environment in the course of an operation is effective from the reliability and cost points of view.

However, generation of such a reference current entails formation of an intermediate resistance between low and high resistances of a memory cell used for storing ordinary data. It is thus necessary to generate the reference current by making use of a plurality of memory cells in a high-resistance state and a plurality of memory cells in a low-resistance state or by combining the memory cells in a high-resistance state and the memory cells in a low-resistance state.

Thus, this embodiment adopts a configuration in which data is read out in a current direction not causing a change of the state of a memory cell used as a reference cell RCL. A best embodiment adopts a typical configuration in which only a memory cell in a high-resistance state is used and data is read out in a current direction not changing the high-resistance state.

The reasons are described as follows. Among configurations to generate a reference level by parallel connection of cells in a high-resistance state, setting the reference level in a simplest way on the configuration of the memory array is considered to be easier.

In addition, since the initial state of a memory cell in a process is a high-resistance state, it is desirable to make use of a cell in a high-resistance state.

For the reasons described above, the basic configuration of the memory and reference cells is described as follows.

<2: Memory-Cell Configuration>

Figure 3A:
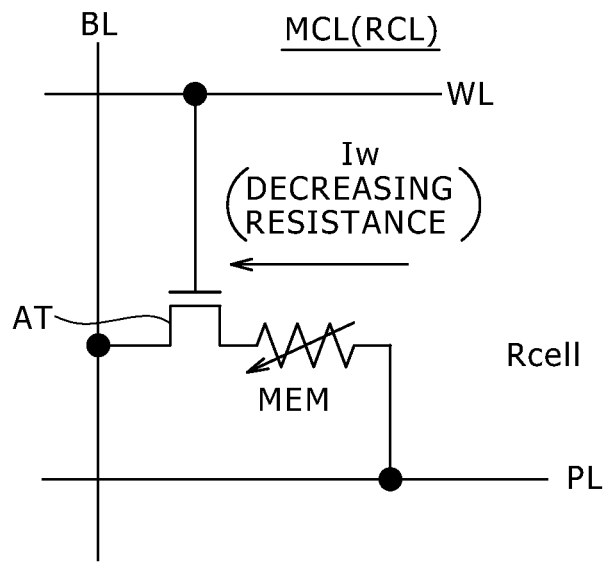
FIGS. 3A and 3B are diagrams each showing an equivalent circuit of a main memory cell or reference cell according to the embodiment.
Figure 3B:
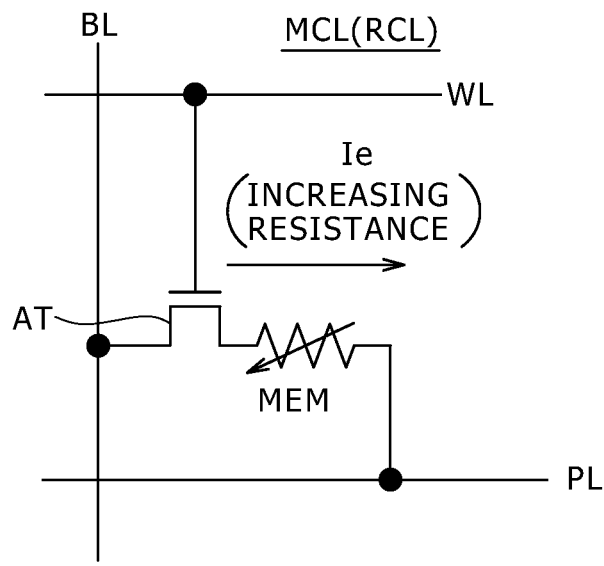

FIGS. 3A and 3B are diagrams each showing an equivalent circuit of a main memory cell or reference cell according to the embodiment.

It is to be noted that an arrow shown in FIG. 3A indicates the direction of a write current Iw whereas an arrow shown in FIG. 3B indicates the direction of an erase current Ie. However, the configurations shown in FIGS. 3A and 3B are each a configuration common to the main memory cell and the reference cell.

The main memory cell MCL (or the reference cell RCL) shown in FIGS. 3A and 3B includes an access transistor AT and a variable-resistance cell resistor MEM which functions as a storage element.

A signal set at one of different polarities is applied to the opposite ends of the variable-resistance cell resistor MEM in order to change the resistance of the variable-resistance cell resistor MEM, that is, in order to increase or decrease the resistance of the variable-resistance cell resistor MEM in a reversible manner.

A specific end of the variable-resistance cell resistor MEM is connected to a plate line PL whereas the other end of the variable-resistance cell resistor MEM is connected to the source electrode of the access transistor AT. The drain electrode of the access transistor AT is connected to a bit line BL whereas the gate electrode of the access transistor AT is connected to a word line WL which is used as an access line.

In the configuration described above, the bit line BL is a typical example of the first line whereas the plate line PL is a typical example of the second line.

FIG. 4 is a diagram showing the configuration of a variable-resistance storage element (variable-resistance cell resistor) 200.

As shown in FIG. 4, the variable-resistance storage element 200 has a configuration in which recording films 203 and 204 are sandwiched between two electrode films, that is, electrode films 201 and 202.

The variable-resistance storage element 200 is a variable-resistance storage element in which the resistances of the recording films 203 and 204 change in a reversible manner due to application of a signal set at one of different polarities to the two electrode films 201 and 202.

The variable-resistance storage element 200 is typically a composition film including two different elements. A specific one of the two elements is selected from Ag, Cu and Zn whereas the other element is selected from S, Se and Te. As a typical alternative, the variable-resistance storage element 200 is a composition film composed of at least two magnetic films which are separated from each other by one of an insulator and a conductor which are provided at a location between the magnetic films.

FIG. 5A to 5D are diagrams each showing a series circuit including the access transistor AT and the variable-resistance storage element (variable-resistance cell resistor) MEM.

The access transistor AT and the variable-resistance storage element MEM are connected to each other to form one of the series circuits shown in FIGS. 5A to 5D.

As described above, it is assumed that, when a current flows through the variable-resistance cell resistor MEM in the direction of an arrow shown on the variable-resistance cell resistor MEM, the resistance state of the variable-resistance cell resistor (storage element) MEM changes from a high-resistance state to a low-resistance state.

Figure 6:
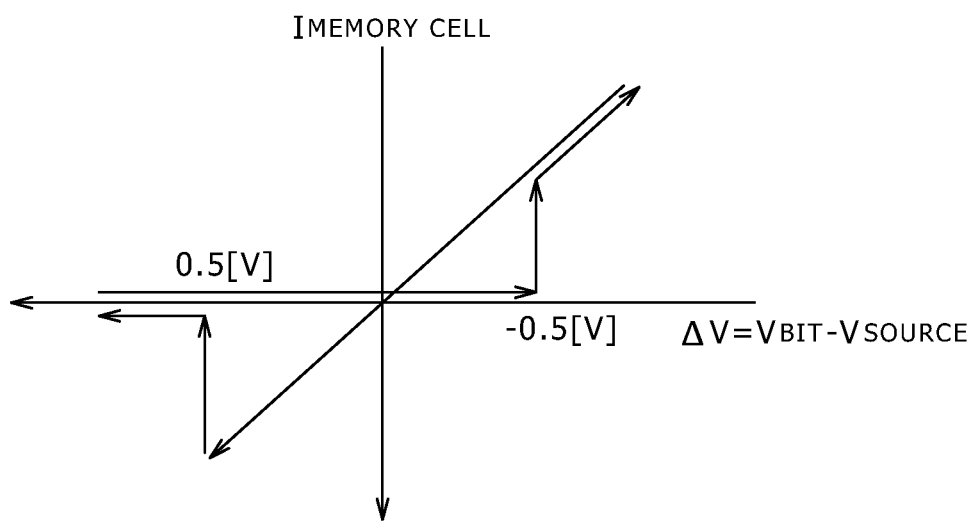
FIG. 6 is a diagram showing an actual voltage-current characteristic of a variable-resistance storage element.

FIG. 6 is a diagram showing an actual voltage-current characteristic of a variable-resistance storage element MEM.

In FIG. 6, the horizontal axis represents the voltage applied to the variable-resistance storage element MEM whereas the vertical axis represents the cell current flowing through the variable-resistance storage element MEM.

In the case of a variable-resistance storage element MEM having a resistance of at least several mega-ohms, for example, when a voltage of at least 0.5 V is applied to the variable-resistance storage element MEM, the cell current increases abruptly and the resistance decreases to several kilo-ohms.

Then, in a later certain range, the cell current is proportional to the voltage. That is to say, the variable-resistance storage element MEM has a low constant resistance.

The operation described above is defined as a write operation and the state obtained as a result of the operation is referred to as a low-resistance state. In addition, a voltage at which the resistance of the variable-resistance storage element MEM changes from the high resistance to the low resistance is defined as a write threshold voltage.

Then, when a voltage having a reversed polarity of 0.5 V is applied to the variable-resistance storage element MEM, the current flowing though the variable-resistance storage element MEM having a resistance of several kilo-ohms abruptly decreases and the resistance increases to a value higher than several mega-ohms.

The operation described above is defined as an erase operation and the state obtained as a result of the operation is referred to as a high-resistance state. In addition, a voltage at which the resistance of the variable-resistance storage element MEM changes from the low resistance to the high resistance is defined as an erase threshold voltage.

As described above, the resistance of the variable-resistance storage element MEM changes from several kilo-ohms to several mega-ohms and vice versa in a reversible manner due to application of positive and negative voltages to the two electrodes of the variable-resistance storage element MEM.

In addition, the variable-resistance storage element MEM can be put in one of two states, that is, the low-resistance state and the high-resistance state. Thus, by associating the two states with data of 1 and data of 0 respectively, the variable-resistance storage element MEM can be used for storing data of 1 bit.

Figure 7:
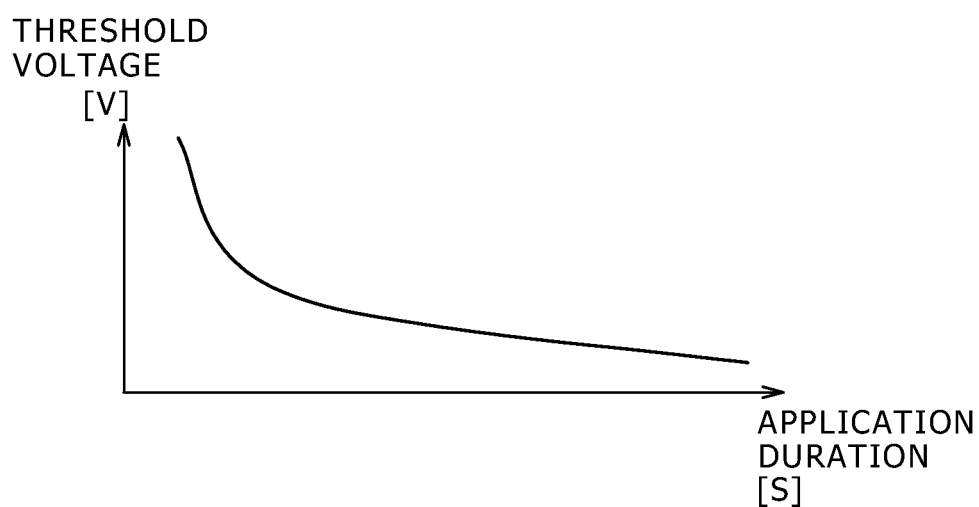
FIG. 7 is a diagram showing a relation between a read-out voltage and an application duration for a case in which a read-out operation is carried out in a direction in which the state changes in a reversible manner.

FIG. 7 is a diagram showing a relation between a read-out voltage and an application duration for a case in which a read-out operation is carried out in a direction in which the state changes in a reversible manner.

In FIG. 7, the horizontal axis represents the voltage application duration whereas the vertical axis represents the threshold voltage.

The write and erase threshold voltages at which the state changes much depend on the time duration during which a voltage is being applied to the variable-resistance storage element MEM. To be more specific, the variable-resistance storage element MEM exhibits a property that, the longer the time duration during which a voltage is being applied to the variable-resistance storage element MEM, the lower the write threshold voltage and the erase threshold voltage.

The time duration during which a voltage is being applied to the variable-resistance storage element MEM can be interpreted as a total time which is defined as the sum of times during which a voltage is being applied to the variable-resistance storage element MEM. That is to say, the variable-resistance storage element MEM exhibits a property that, the longer the total time, the lower the write threshold voltage and the erase threshold voltage. For example, if a low voltage is applied to the variable-resistance storage element MEM consecutively, the state of the resistance of the variable-resistance storage element MEM will change inevitably even though application of the low voltage for a short time to the variable-resistance storage element MEM does not change the state.

That is to say, a high access frequency of a read-out operation carried out by applying a low voltage to the reference cell inevitably changes the state of the resistance of the reference cell as long as the read-out operation is carried out in a current direction changing the state in a reversible manner even if the read-out operation carried out in a low voltage does not change the state.

If the read-out operation is carried out on the reference cell in a current direction not changing the state of the resistance of the reference cell in a reversible manner, that is, if the read-out operation is carried out by a read-out current following in the reversed direction, however, the change of the state can be avoided.

The first and second memory array sections 110 and 120 employed in the memory chip 100 in which memory cells are laid out to form a matrix have peripheral circuits described as follows.

The peripheral circuits include the first row decoder 130, the second row decoder 140, the first column decoder 150 and the second column decoder 160 which are used for generating storage information used for selecting a specific memory cell.

In addition, the peripheral circuits also include the write driver 180 for recording data into a selected memory cell and the sense amplifier 170 for recognizing the state of data recorded in the selected memory cell.

In addition, since the reference-cell configuration is a characteristic of this embodiment, the following description focuses on paths of read-out data.

FIG. 2 shows main sections of a read-out system, and the following description focuses on the memory array sections including reference cells RCL, and the sense amplifier 170.

FIG. 2 shows an open bit line configuration as an example. As another example, however, a folded bit line configuration can also be adopted if the configuration implements the present disclosure.

The read-out system includes the first memory array section 110 on the upper side and the second memory array section 120 on the lower side. The first memory array section 110 includes the main memory cell array 111 and the reference cell section 112 whereas the second memory array section 120 includes the main memory cell array 121 and the reference cell section 122. The sense amplifier 170 is provided at a location sandwiched by the first memory array section 110 and the second memory array section 120. Information supplied from an external source is stored at a specified address in the main memory cell arrays 111 and 121.

In order to identify information stored at a specified address in the main memory cell array 111 employed in the first memory array section 110 for example, the following processing is carried out.

First of all, the specified address in the main memory cell array 111 employed in the first memory array section 110 is selected. At the same time, the reference cell section 122 employed in the second memory array section 120 is also selected in processing carried out concurrently.

Then, the sense amplifier 170 compares a current flowing through the first line BL11 connected to the main memory cell MCL at the selected address in the first memory array section 110 with a current flowing through the first line BL21 connected to a reference cell RCL of the selected reference cell section 122 employed in the second memory array section 120.

The sense amplifier 170 compares the current flowing through the first line BL11 with the current flowing through the first line BL21 as described above in order to determine information stored in the main memory cell MCL at the selected address in the first memory array section 110.

The main memory cell MCL used for storing the information can be in a high-resistance state representing resistances of several mega-ohms or in a low-resistance state representing resistances of several kilo-ohms. On the other hand, the resistance of the reference cell RCL has an intermediate value between the resistances represented by the high-resistance state and the resistances represented by the low-resistance state.

Normally, a reference cell RCL is provided for 1,000 to 10,000 main memory cells MCL.

It is necessary to carry out a read-out operation by applying a voltage much lower than the threshold voltage to the main memory cell MCL so that information stored in the main memory cell MCL is not destroyed by the applied voltage. However, the reference cell RCL is accessed at a frequency which is 1,000 to 10,000 times higher than the frequency of accesses made to the main memory cell MCL.

If a read-out operation is carried out on a reference cell RCL in a direction to change the state of the reference cell RCL at a high access frequency, as described earlier, the threshold voltage at which the state changes decreases, increasing the probability that the state changes inevitably. In addition, the higher the access frequency, the larger the decrease of the threshold voltage.

Since the reference cell RCL is used in a state in which the storage state of the variable-resistance storage element MEM also referred to as a variable-resistance cell resistor has been settled in advance, however, if the access to the reference cell RCL is made in a direction not destroying the data stored in the reference cell RCL, the state of the reference cell RCL does not change no matter how high the frequency of accesses to the reference cell RCL is.

For the reason described above, the embodiment adopts a configuration in which the direction of a current supplied to a reference cell RCL for an access to the reference cell RCL is determined in accordance with the state of the reference cell RCL.

In addition, since the write and erase reliability of the variable-resistance memory device is poor, it is necessary to verify whether or not data has been recorded into a memory cell in the device.

Thus, it is necessary to provide not only a reference level to be used for identifying ordinary information, but also a low reference level to be used in a write operation and a high reference level to be used for identifying an erase operation.

The following description explains various concrete typical configurations of a reference cell section for realizing a reference level on the basis of a plurality of reference cells RCL existing in the reference cell section by combining the reference cells RCL.

In the following description, the reference cell section 112 employed in the first memory array section 110 is taken as an example. It is to be noted that, however, that the following description also holds true for the reference cell section 122 employed in the second memory array section 120.

<3: First Typical Configuration of the Reference Cell Section>

Figure 8:
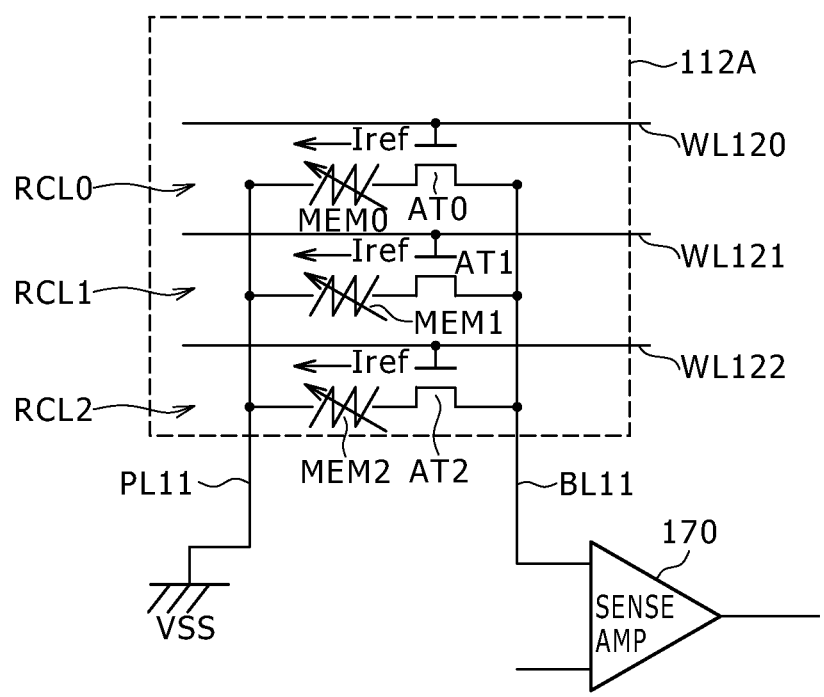
FIG. 8 is a diagram showing a first typical configuration of a reference cell section according to the embodiment.

FIG. 8 is a diagram showing a first typical configuration of a reference cell section 112A according to the embodiment.

The reference cell section 112A shown in FIG. 8 is a typical example which is configured to make use of only cells in a high resistance state.

The reference cell section 112A shown in FIG. 8 is configured to include reference cells RCL0, RCL1 and RCL2 which are connected in parallel to each other between the first line (bit line) BL11 and the second line (plate line) PL11.

The gate electrode of the access transistor AT0 employed in the reference cell RCL0 is connected to the reference word line WL120.

By the same token, the gate electrode of the access transistor AT1 employed in the reference cell RCL1 is connected to the reference word line WL121.

In the same way, the gate electrode of the access transistor AT2 employed in the reference cell RCL2 is connected to the reference word line WL122.

In order to make the following description simple, FIG. 8 shows a combination of the three reference cells RCL0, RCL1 and RCL2. It is to be noted, however, that the number of reference cells is not limited to three. This is because it is important to set a reference current on the basis of the resistance states of the reference cells.

In the reference cell section 112A shown in FIG. 8, the resistance of the variable-resistance storage elements MEM0, MEM1, and MEM2 serving as variable-resistance cell resistors in the reference cells RCL0, RCL1, and RCL2 are assumed to be 1 mega-ohm.

By making accesses to (or by selecting) any two of the reference cells RCL0, RCL1 and RCL2 at the same time, it is possible to generate a reference level of 500 kilo-ohms required for the ordinary read-out level.

For example, the reference word lines WL120 and WL121 are set at a high level in order to select the reference cells RCL0 and RCL1 respectively. In this case, it is possible to generate a reference level of 500 kilo-ohms required for the read-out level.

In addition, by selecting one reference cell, it is possible to generate a reference level of 1 mega-ohm required in verification of an erase operation.

For example, the reference word line WL120 is set at a high level in order to select the reference cell RCL0. In this case, it is possible to generate a reference level of 1 mega-ohm required in verification of an erase operation.

In addition, by making accesses to (or by selecting) the three reference cells RCL0, RCL1 and RCL2 at the same time, it is possible to generate a reference level of 333 kilo-ohms required for the write operation.

For example, the reference word lines WL120, WL121 and WL122 are set at a high level in order to select all the reference cells RCL0, RCL1 and RCL2 respectively. In this case, it is possible to generate a reference level of 333 kilo-ohms required for the write operation.

<4: Second Typical Configuration of the Reference Cell Section>

Figure 9:
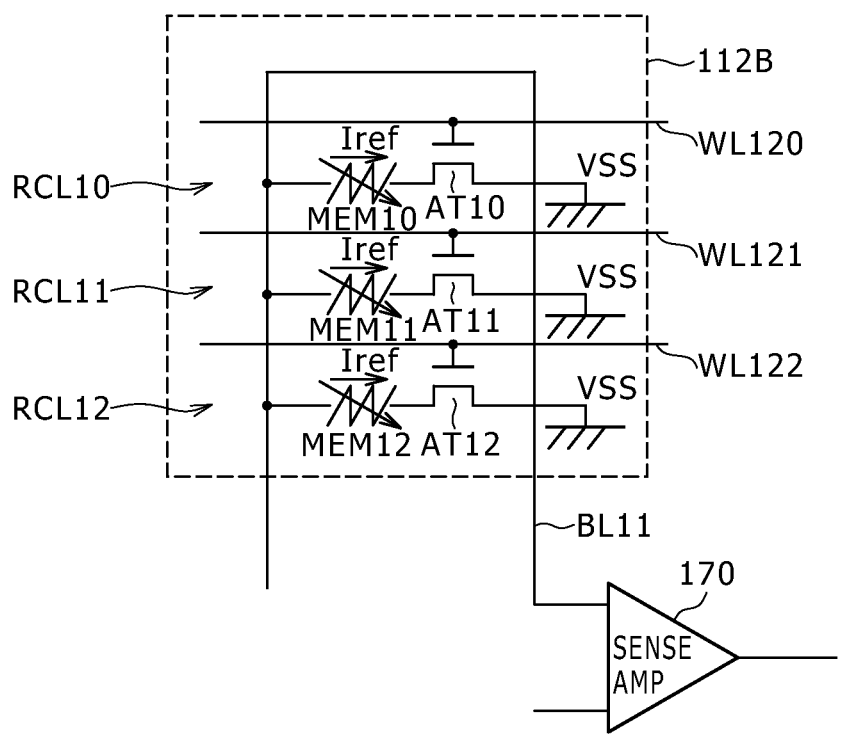
FIG. 9 is a diagram showing a second typical configuration of the reference cell section according to the embodiment.

FIG. 9 is a diagram showing a second typical configuration of a reference cell section 112B according to the embodiment.

The reference cell section 112B shown in FIG. 9 is a typical example which is configured to make use of only cells in a low resistance state.

The reference cell section 112B shown in FIG. 9 is configured to include reference cells RCL10, RCL11 and RCL12 which are connected in series to each other between the first line (bit line) BL11 and a line supplying a reference electric potential VSS. In this typical example, the reference electric potential VSS is the electric potential of the ground.

The gate electrode of the access transistor AT10 employed in the reference cell RCL10 is connected to the reference word line WL120.

By the same token, the gate electrode of the access transistor AT11 employed in the reference cell RCL11 is connected to the reference word line WL121.

In the same way, the gate electrode of the access transistor AT12 employed in the reference cell RCL12 is connected to the reference word line WL122.

In order to make the following description simple, FIG. 9 shows a combination of the three reference cells RCL10, RCL11 and RCL12. It is to be noted, however, that the number of reference cells is not limited to three. This is because it is important to set a reference current on the basis of the resistance states of the reference cells.

In the reference cell section 112B shown in FIG. 9, the resistance of the variable-resistance storage element MEM10 serving as a variable-resistance cell resistor in the reference cell RCL10 is assumed to be 10 kilo-ohms. Also, the resistance of the variable-resistance storage element MEM11 serving as a variable-resistance cell resistor in the reference cell RCL11 is assumed to be 50 kilo-ohms. Furthermore, the resistance of the variable-resistance storage element MEM12 serving as a variable-resistance cell resistor in the reference cell RCL12 is assumed to be 100 kilo-ohms.

In the reference cell section 112B shown in FIG. 9, if the resistance of a reference cell is 10 kilo-ohms, it may be impossible to make a high resistance of several hundreds of kilo-ohms.

Thus, in order to generate a variety of reference levels by making use of cells in a low-resistance state, it is necessary to make small-size storage elements at a process time to serve as the cells. In the case of this embodiment for example, the variable-resistance storage elements MEM10, MEM11 and MEM12 having resistances of 10 kilo-ohms, 50 kilo-ohms and 100 kilo-ohms respectively are prepared in advance.

In this way, the reference cells RCL10, RCL11 and RCL12 have resistances of 10 kilo-ohms, 50 kilo-ohms and 100 kilo-ohms respectively.

By selecting one cell having a resistance of 50 kilo-ohms, it is possible to generate a reference level of 50 kilo-ohms required for the ordinary read-out level.

In this typical example, the reference word line WL121 is set at a high level in order to select the reference cell RCL11. In this case, it is possible to generate a reference level of 50 kilo-ohms required for the read-out level.

By selecting one cell having a resistance of 100 kilo-ohms, it is possible to generate a reference level of 100 kilo-ohms as a reference level required in verification of an erase operation.

In this typical example, the reference word line WL122 is set at a high level in order to select the reference cell RCL12. In this case, it is possible to generate a reference level of 100 kilo-ohms required in verification of an erase operation.

By selecting one cell having a resistance of 10 kilo-ohms, it is possible to generate a reference level of 10 kilo-ohms required for the write operation.

In this typical example, the reference word line WL120 is set at a high level in order to select the reference cell RCL10. In this case, it is possible to generate a reference level of 10 kilo-ohms required for the write operation.

It is to be noted that, by providing a configuration in which reference cells are connected to each other in series, it is also possible to implement a method for generating the reference levels described.

In the case of such a configuration, however, a select switch is required. Thus, the size of the reference cell tends to increase even though the method itself is feasible.

<5: Third Typical Configuration of the Reference Cell Section>

Figure 10:
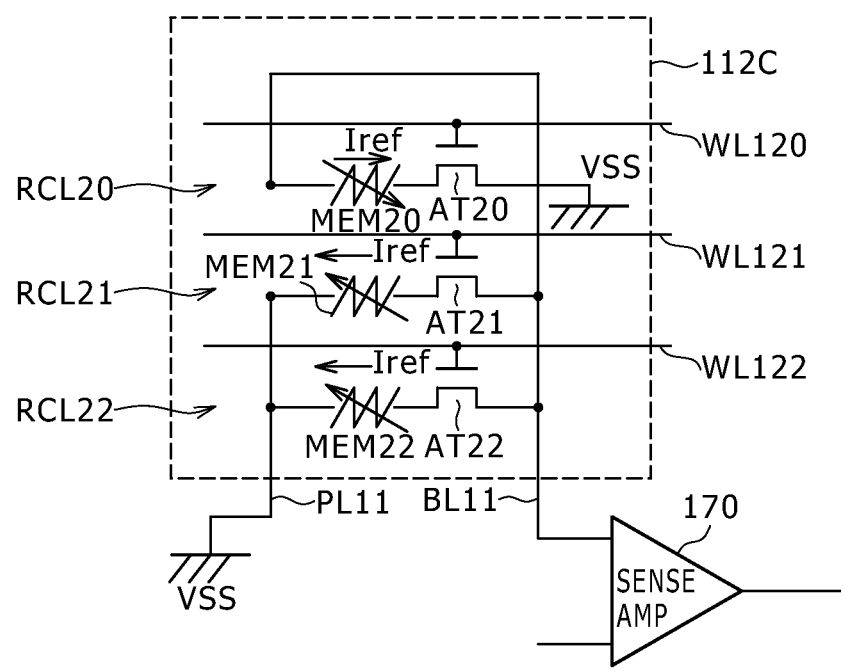
FIG. 10 is a diagram showing a third typical configuration of the reference cell section according to the embodiment.

FIG. 10 is a diagram showing a third typical configuration of a reference cell section 112C according to the embodiment.

The reference cell section 112C shown in FIG. 10 is a typical example which is configured to make use of cells in a low resistance state and a high resistance state.

The reference cell section 112C shown in FIG. 10 is configured to include a reference cell RCL20 connected in parallel between the first line BL11 also referred to as the bit line BL11 and a line for supplying a reference electric potential VSS to serve as a reference cell in a low resistance state. In this typical example, the reference electric potential VSS is the electric potential of the ground.

In addition, the reference cell section 112C shown in FIG. 10 is configured to include also reference cells RCL21 and RCL22 which are connected in parallel to each other between the first line (bit line) BL11 and the second line (plate line) PL11 to serve as reference cells in a high resistance state.

The gate electrode of the access transistor AT20 employed in the reference cell RCL20 is connected to the reference word line WL120.

By the same token, the gate electrode of the access transistor AT21 employed in the reference cell RCL21 is connected to the reference word line WL121.

In the same way, the gate electrode of the access transistor AT22 employed in the reference cell RCL22 is connected to the reference word line WL122.

In order to make the following description simple, FIG. 10 shows a combination of the three reference cells RCL20, RCL21 and RCL22. It is to be noted, however, that the number of reference cells is not limited to three. This is because it is important to set a reference current on the basis of the resistance states of the reference cells.

In the reference cell section 112C shown in FIG. 10, the resistance of the variable-resistance storage element MEM20 serving as a variable-resistance cell resistor in the reference cell RCL20 is assumed to be 10 kilo-ohms. The resistance of the variable-resistance storage element MEM21 serving as a variable-resistance cell resistor in the reference cell RCL21 in the reference cell section 112C shown in FIG. 10 is assumed to be 1 mega-ohm. By the same token, the resistance of the variable-resistance storage element MEM22 serving as a variable-resistance cell resistor in the reference cell RCL22 in the reference cell section 112C shown in FIG. 10 is assumed to be also 1 mega-ohm.

By making two concurrent accesses to the 1 mega-ohm cells in the high-resistance state at the same time, that is, by selecting both the cells at the same time, it is possible to generate a reference level of 500 kilo-ohms required for the ordinary read-out level.

For example, the reference word lines WL121 and WL122 are set at a high level in order to select all the reference cells RCL21 and RCL22 respectively. In this case, it is possible to generate a reference level of 500 kilo-ohms required for the read-out level.

In addition, by selecting a cell in the high-resistance state, it is possible to generate a reference level of 1 mega-ohm required in verification of the erase operation.

For example, the reference word line WL121 is set at a high level in order to select the reference cell RCL21. In this case, it is possible to generate a reference level of 1 mega-ohm required in verification of an erase operation.

In addition, by selecting the cell in the low-resistance state of having a resistance of 10 kilo-ohms, it is possible to generate a reference level of 10 kilo-ohms required for the write operation.

In the case of this typical example, the reference word line WL120 is set at a high level in order to select the reference cell RCL20. In this case, it is possible to generate a reference level of 10 kilo-ohms required for the write operation.

It is to be noted that, by providing a configuration in which reference cells are connected to each other in series, it is also possible to implement a method for generating reference levels other than those described.

In the case of such a configuration, however, a select switch is required. Thus, the size of the reference cell tends to increase even though the method itself is feasible.

As described above, in accordance with the embodiment, the following effects can be obtained.

In the configuration, a read-out current is set on the basis of resistance states of reference cells. Thus, it is possible to generate a more reliable reference current without causing a resistance change due to an incorrect write operation.

In the future, storage elements will be mass-produced. In a future configuration including a large number of storage elements, the larger the ratio of the main memory cell count to the reference cell count, the larger the number of accesses made to reference cells. In spite of the large number of accesses made to the reference cells, an embodiment of the present disclosure provides improved reliability without entailing changes of the low resistance state of the reference cells.

It is to be noted that an embodiment of the present disclosure can adopt following configurations.

(1) A variable-resistance memory device including:

a memory array section having a main memory cell employing a storage element having a resistance increasing and decreasing in a reversible manner in accordance with application of a signal set at one of different polarities to the opposite ends of the storage element; and a reference cell section having a reference cell provided with a storage element having a resistance increasing and decreasing in a reversible manner in accordance with application of a signal set at one of different polarities to the opposite ends of the storage element and generating a reference current used for recognizing data of the main memory cell, in which the direction of an applied current serving as the reference current is set in accordance with the resistance state of the reference cell.

(2) The variable-resistance memory device according to the paragraph (1), in which the storage element employed in the main memory cell and the reference cell is in either one of a high resistance state and a low resistance state which represent respectively two states of data stored in the storage element, the reference cell section has the reference cell in the high resistance state, and the reference cell is used as single units or connected in parallel to each other in order to generate the reference current in a current direction not changing a storage state which is the high resistance state of the reference cell.

(3) The variable-resistance memory device according to the paragraph (1), in which the storage element employed in the main memory cell and the reference cell is in either one of a high resistance state and a low resistance state which represent respectively two states of data stored in the storage element, the reference cell section has the reference cell in the low resistance state, and the reference cell is used as single units or connected in series to each other in order to generate the reference current in a current direction not changing a storage state which is the low resistance state of the reference cell.

(4) The variable-resistance memory device according to the paragraph (1), in which the storage element employed in the main memory cell and the reference cell is in either one of a high resistance state and a low resistance state which represent respectively two states of data stored in the storage element, the reference cell section is configured as a plurality of combinations including the reference cell in the high resistance state and the reference cell in the low resistance state, and the reference cell is used as single units, connected in series to each other, or connected in parallel to each other in order to generate the reference current in a current direction not changing storage states which are the high resistance state of the reference cell and the low resistance state of the reference cell.

(5) The variable-resistance memory device according to the paragraph (2), in which each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, and for the reference cell employed in the reference cell section, the specific one of the opposite ends of the current path is connected to the first line whereas the other one of the opposite ends of the current path is connected to the second line.

(6) The variable-resistance memory device according to the paragraph (3), in which each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, and for the reference cell employed in the reference cell section, the specific one of the opposite ends of the current path is connected to a line supplying a reference electric potential whereas the other one of the opposite ends of the current path is connected to the first line.

(7) The variable-resistance memory device according to the paragraph (4), in which each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, for the reference cell employed in the reference cell section to serve as a reference cell in a high resistance state, the specific one of the opposite ends of the current path is connected to the first line whereas the other one of the opposite ends of the current path is connected to the second line, and for the reference cell employed in the reference cell section to serve as a reference cell in a low resistance state, the specific one of the opposite ends of the current path is connected to a line supplying a reference electric potential whereas the other one of the opposite ends of the current path is connected to the first line.

(8) The variable-resistance memory device according to any one of the paragraphs (1) to (7), including a sense amplifier configured to compare a current flowing to the selected main memory cell with a current flowing to the reference cell section.

(9) A method for driving a variable-resistance memory device including:

reading out data from a main memory cell to a first bit line by changing the resistance of a storage element of the main memory cell through application of a signal set at one of different polarities to the opposite ends of the storage element so as to increase or decrease the resistance in a reversible manner;

generating a reference current flowing to a second bit line as a reference current, which is necessary for recognizing data of the main memory cell, by making use of a reference cell including a storage element having a resistance increasing and decreasing in a reversible manner in accordance with application of a signal set at one of different polarities to the opposite ends of the storage element; and determining information stored in the main memory cell by making use of a sense amplifier for comparing a current flowing to the first bit line read out above with the reference current flowing to the second bit line, in which the direction of an applied current serving as the reference current is set in accordance with the resistance state of the reference cell.

The present disclosure contains subject matter related to that disclosed in Japanese Priority Patent Application JP 2011-183829 filed in the Japan Patent Office on Aug. 25, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A variable-resistance memory device comprising:
   a memory array section including a main memory cell employing a storage element having a resistance increasing and decreasing in a reversible manner in accordance with application of a signal set at one of different polarities to the opposite ends of the storage element; and a reference cell section including a reference cell provided with a storage element having a resistance increasing and decreasing in a reversible manner in accordance with application of a signal set at one of different polarities to the opposite ends of the storage element and generating a reference current used for recognizing data of the main memory cell, wherein the direction of an applied current serving as the reference current is set in accordance with the resistance state of the reference cell, wherein the storage elements of the main memory cell and the reference cell are respectively configured to be in either one of a high resistance state and a low resistance state which represent respectively two states of data stored in the storage element, the reference cell is in the high resistance state, and the reference cell is used as a single unit or is connected in parallel with another reference cell in order to generate the reference current in a current direction that does not change the high resistance state of the reference cell.

2. The variable-resistance memory device according to claim 1, wherein each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, and for the reference cell employed in the reference cell section, the specific one of the opposite ends of the current path is connected to the first line whereas the other one of the opposite ends of the current path is connected to the second line.

3. A variable-resistance memory device comprising:

a memory array section including a main memory cell employing a storage element having a resistance increasing and decreasing in a reversible manner in accordance with application of a signal set at one of different polarities to the opposite ends of the storage element; and a reference cell section including a reference cell provided with a storage element having a resistance increasing and decreasing in a reversible manner in accordance with application of a signal set at one of different polarities to the opposite ends of the storage element and generating a reference current used for recognizing data of the main memory cell, wherein the direction of an applied current serving as the reference current is set in accordance with the resistance state of the reference cell, wherein the storage elements of the main memory cell and the reference cell are respectively configured to be in either one of a high resistance state and a low resistance state which represent respectively two states of data stored in the storage element, the reference cell is in the low resistance state, and the reference cell is used as a single unit or is connected in series with another reference cell in order to generate the reference current in a current direction that does not change the low resistance state of the reference cell.

4. The variable-resistance memory device according to claim 3, wherein each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, and for the reference cell employed in the reference cell section, the specific one of the opposite ends of the current path is connected to a line supplying a reference electric potential whereas the other one of the opposite ends of the current path is connected to the first line.

5. A variable-resistance memory device comprising:

a memory array section including a main memory cell employing a storage element having a resistance increasing and decreasing in a reversible manner in accordance with application of a signal set at one of different polarities to the opposite ends of the storage element; and a reference cell section including a reference cell provided with a storage element having a resistance increasing and decreasing in a reversible manner in accordance with application of a signal set at one of different polarities to the opposite ends of the storage element and generating a reference current used for recognizing data of the main memory cell, wherein the direction of an applied current serving as the reference current is set in accordance with the resistance state of the reference cell, wherein the storage elements of the main memory cell and the reference cell are respectively configured to be in either one of a high resistance state and a low resistance state which represent respectively two states of data stored in the storage element, the reference cell section includes a combination of respective reference cells in the high resistance state and respective reference cells in the low resistance state, and respective reference cells are used as single units, are connected in series to each other, or are connected in parallel to each other in order to generate the reference current in a current direction that does not change the high resistance state of the reference cell or the low resistance state of the reference cell.

6. The variable-resistance memory device according to claim 5, wherein each of the main memory cell and the reference cell has a current path connecting the storage element in series to an access transistor employed in the main memory cell and the reference cell respectively, the data storage state of the storage element changes due to a change exhibited by the resistance of the storage element as a resistance change caused by a voltage applied to the storage element, for the main memory cell employed in the memory array section, a specific one of the opposite ends of the current path is connected to a first line whereas the other one of the opposite ends of the current path is connected to a second line, for the reference cell employed in the reference cell section to serve as a reference cell in a high resistance state, the specific one of the opposite ends of the current path is connected to the first line whereas the other one of the opposite ends of the current path is connected to the second line, and for the reference cell employed in the reference cell section to serve as a reference cell in a low resistance state, the specific one of the opposite ends of the current path is connected to a line supplying a reference electric potential whereas the other one of the opposite ends of the current path is connected to the first line.

7. The variable-resistance memory device according to claim 1, comprising
a sense amplifier configured to compare a current flowing to the selected main memory cell with a current flowing to the reference cell section.

8. A method for driving a variable-resistance memory device comprising:
reading out data from a main memory cell to a first bit line by changing the resistance of a storage element of the main memory cell through application of a signal set at one of different polarities to the opposite ends of the storage element so as to increase or decrease the resistance in a reversible manner;
generating a reference current flowing to a second bit line as a reference current, which is used for recognizing data of the main memory cell, by making use of a reference cell including a storage element having a resistance increasing and decreasing in a reversible manner in accordance with application of a signal set at one of different polarities to the opposite ends of the storage element; and
determining information stored in the main memory cell by making use of a sense amplifier for comparing a current flowing to the first bit line read out above with the reference current flowing to the second bit line,
wherein the direction of an applied current serving as the reference current is set in accordance with the resistance state of the reference cell.

9. The variable-resistance memory device according to claim 3, comprising
a sense amplifier configured to compare a current flowing to the selected main memory cell with a current flowing to the reference cell section.

10. The variable-resistance memory device according to claim 5, comprising
a sense amplifier configured to compare a current flowing to the selected main memory cell with a current flowing to the reference cell section.

11. The method according to claim 8, wherein
the storage elements of the main memory cell and the reference cell are respectively configured to be in either one of a high resistance state and a low resistance state which represent respectively two states of data stored in the storage element, and
the reference cell is in the high resistance state, the method further comprising:
using the reference cell as single units or as connected in parallel with another reference cell in order to generate the reference current in a current direction that does not change the high resistance state of the reference cell.

12. The method according to claim 11, wherein
each of the main memory cell and the reference cell has a current path connecting the storage element in series to an access transistor employed in the main memory cell and the reference cell respectively:
for the main memory cell employed in the memory array section, a specific one of the opposite ends of the current path is connected to a first line whereas the other one of the opposite ends of the current path is connected to a second line, and
for the reference cell employed in the reference cell section, the specific one of the opposite ends of the current path is connected to the first line whereas the other one of the opposite ends of the current path is connected to the second line, the method further comprising:
applying a voltage to the storage element, thereby changing the data storage state of the storage element due to a change exhibited by the resistance of the storage element.

13. The method according to claim 8, wherein
the storage elements of the main memory cell and the reference cell are respectively configured to be in either one of a high resistance state and a low resistance state which represent respectively two states of data stored in the storage element, and
the reference cell is in the low resistance state, the method further comprising:
using the reference cell is as single units or as connected in series with another reference cell in order to generate the reference current in a current direction that does not change the low resistance state of the reference cell.

14. The method according to claim 13, wherein
each of the main memory cell and the reference cell has a current path connecting the storage element in series to an access transistor employed in the main memory cell and the reference cell respectively,
for the main memory cell employed in the memory array section, a specific one of the opposite ends of the current path is connected to a first line whereas the other one of the opposite ends of the current path is connected to a second line, and
for the reference cell employed in the reference cell section, the specific one of the opposite ends of the current path is connected to a line supplying a reference electric potential whereas the other one of the opposite ends of the current path is connected to the first line, the method further comprising:
applying a voltage to the storage element, thereby changing the data storage state of the storage element due to a change exhibited by the resistance of the storage element.

15. The method according to claim 8, wherein
the storage elements of the main memory cell and the reference cell are respectively configured to be in either one of a high resistance state and a low resistance state which represent respectively two states of data stored in the storage element, and
the reference cell section includes a combination of respective reference cells in the high resistance state and respective reference cells in the low resistance state, the method further comprising:
using the respective reference cells as single units, as connected in series to each other, or as connected in parallel to each other in order to generate the reference current in a current direction that does not change the high resistance state of the reference cell or the low resistance state of the reference cell.

16. The method according to claim 15, wherein
- each of the main memory cell and the reference cell has a current path connecting the storage element in series to an access transistor employed in the main memory cell and the reference cell respectively,
- for the main memory cell employed in the memory array section, a specific one of the opposite ends of the current path is connected to a first line whereas the other one of the opposite ends of the current path is connected to a second line,
- for the reference cell employed in the reference cell section to serve as a reference cell in a high resistance state, the specific one of the opposite ends of the current path is connected to the first line whereas the other one of the opposite ends of the current path is connected to the second line, and
- for the reference cell employed in the reference cell section to serve as a reference cell in a low resistance state, the specific one of the opposite ends of the current path is connected to a line supplying a reference electric potential whereas the other one of the opposite ends of the current path is connected to the first line, the method further comprising:
- applying a voltage to the storage element, thereby changing the data storage state of the storage element due to a change exhibited by the resistance of the storage element.

17. The method according to claim 8, further comprising
- comparing, by a sense amplifier, a current flowing to the selected main memory cell with a current flowing to the reference cell section.

* * * * *